(12) United States Patent
Zeng et al.

(10) Patent No.: US 11,917,763 B2
(45) Date of Patent: Feb. 27, 2024

(54) FINGERPRINT IDENTIFICATION APPARATUS AND ELECTRONIC DEVICE

(71) Applicant: SHENZHEN GOODIX TECHNOLOGY CO., LTD., Shenzhen (CN)

(72) Inventors: Fanzhou Zeng, Shenzhen (CN); Xiangying Liu, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 581 days.

(21) Appl. No.: 17/024,154

(22) Filed: Sep. 17, 2020

(65) Prior Publication Data
US 2021/0004558 A1    Jan. 7, 2021

Related U.S. Application Data

(63) Continuation of application No. PCT/CN2019/113720, filed on Oct. 28, 2019.

(51) Int. Cl.
*G06K 9/00*    (2022.01)
*H05K 1/18*    (2006.01)
(Continued)

(52) U.S. Cl.
CPC ......... *H05K 1/189* (2013.01); *G06V 40/1318* (2022.01); *H05K 1/0284* (2013.01);
(Continued)

(58) Field of Classification Search
CPC ...... H05K 1/189; H05K 1/0284; H05K 1/181; H05K 2201/09045; H05K 2201/10121;
(Continued)

(56) References Cited

U.S. PATENT DOCUMENTS

2005/0179368 A1    8/2005   Ryu et al.
2014/0181962 A1    6/2014   Seo et al.
(Continued)

FOREIGN PATENT DOCUMENTS

CN    104049828 A    9/2014
CN    104182727 A    12/2014
(Continued)

OTHER PUBLICATIONS

Zhou, Y., "Overview of screen lock and unlock technology based on mobile terminals" [J]. Science and Technology Innovation, Jul. 20, 2018, pp. 67-68, vol. 20, together with an English language abstract.
(Continued)

*Primary Examiner* — Abdul-Samad A Adediran
(74) *Attorney, Agent, or Firm* — Scully, Scott, Murphy & Presser, P.C.

(57) ABSTRACT

A fingerprint identification apparatus and an electrode device. The fingerprint identification apparatus could be configured to be disposed under a variety of different display screens, reducing a thickness of space for installation of the fingerprint identification apparatus under a screen. The fingerprint identification apparatus includes: a support plate; and at least one fingerprint sensor chip, the at least one fingerprint sensor chip being disposed at an upper surface of the support plate; where the support plate is configured to be mounted to an upper surface of a middle frame of the electronic device so that the at least one fingerprint sensor chip is located under the display screen of the electronic device; and the at least one fingerprint sensor chip is configured to receive a fingerprint detecting signal returned by reflection or scattering via a human finger on the display screen.

20 Claims, 6 Drawing Sheets

(51) Int. Cl.
*H05K 1/02* (2006.01)
*G06V 40/13* (2022.01)

(52) U.S. Cl.
CPC ... *H05K 1/181* (2013.01); *H05K 2201/09045* (2013.01); *H05K 2201/10121* (2013.01); *H05K 2201/10151* (2013.01)

(58) Field of Classification Search
CPC ..... H05K 2201/10151; G06V 40/1318; G06V 40/1365; G06F 3/0421; G06F 3/041
USPC .................................................. 361/679.01
See application file for complete search history.

(56) References Cited

U.S. PATENT DOCUMENTS

| | | | |
|---|---|---|---|
| 2015/0334859 | A1* | 11/2015 | Lee ................ G06V 40/1365 361/679.01 |
| 2017/0118838 | A1 | 4/2017 | Williams et al. |
| 2017/0206644 | A1 | 7/2017 | Megginson et al. |
| 2017/0316248 | A1 | 11/2017 | He et al. |
| 2018/0096187 | A1 | 4/2018 | Kwon et al. |
| 2018/0101718 | A1 | 4/2018 | Lowe et al. |
| 2018/0300526 | A1 | 10/2018 | Cho et al. |
| 2018/0322326 | A1 | 11/2018 | Li et al. |
| 2018/0330141 | A1 | 11/2018 | Yang et al. |
| 2018/0343741 | A1 | 11/2018 | Williams et al. |
| 2018/0365472 | A1 | 12/2018 | Cai |
| 2019/0163953 | A1 | 5/2019 | Jin et al. |
| 2019/0213373 | A1* | 7/2019 | Kim ................ G06V 40/1318 |
| 2020/0026901 | A1* | 1/2020 | Chen ................ G06F 3/0421 |
| 2020/0218869 | A1 | 7/2020 | Han |

FOREIGN PATENT DOCUMENTS

| | | |
|---|---|---|
| CN | 105224846 A | 1/2016 |
| CN | 105489591 A | 4/2016 |
| CN | 205177839 U | 4/2016 |
| CN | 205334502 U | 6/2016 |
| CN | 105825165 A | 8/2016 |
| CN | 105956545 A | 9/2016 |
| CN | 206003006 U | 3/2017 |
| CN | 106662900 A | 5/2017 |
| CN | 106993072 A | 7/2017 |
| CN | 107004130 A | 8/2017 |
| CN | 107066946 A | 8/2017 |
| CN | 107169452 A | 9/2017 |
| CN | 107241468 A | 10/2017 |
| CN | 107305411 A | 10/2017 |
| CN | 107451579 A | 12/2017 |
| CN | 206921061 U | 1/2018 |
| CN | 107728846 A | 2/2018 |
| CN | 107910344 A | 4/2018 |
| CN | 107918450 A | 4/2018 |
| CN | 207182337 U | 4/2018 |
| CN | 207182349 U | 4/2018 |
| CN | 207557977 U | 6/2018 |
| CN | 108323207 A | 7/2018 |
| CN | 108596080 A | 9/2018 |
| CN | 108615003 A | 10/2018 |
| CN | 208027381 U | 10/2018 |
| CN | 208027382 U | 10/2018 |
| CN | 108734119 A | 11/2018 |
| CN | 108737643 A | 11/2018 |
| CN | 108810207 A | 11/2018 |
| CN | 108885696 A | 11/2018 |
| CN | 208156697 U | 11/2018 |
| CN | 108962025 A | 12/2018 |
| CN | 109074492 A | 12/2018 |
| CN | 109075141 A | 12/2018 |
| CN | 208283964 U | 12/2018 |
| CN | 109791610 A | 5/2019 |
| CN | 109791611 A | 5/2019 |
| CN | 209297322 U | 8/2019 |
| CN | 209460780 U | 10/2019 |
| EP | 1557891 A2 | 7/2005 |
| EP | 3396442 A1 | 10/2018 |
| JP | 2010020237 A | 1/2010 |
| KR | 101165087 B1 | 7/2012 |
| KR | 20150133048 A | 11/2015 |
| KR | 20180005588 A | 1/2018 |
| KR | 20180005994 A | 1/2018 |
| KR | 20180043307 A | 4/2018 |
| TW | 201830281 A | 8/2018 |
| WO | 2017031634 A1 | 3/2017 |
| WO | 2018135780 A1 | 7/2018 |
| WO | 2020019263 A1 | 1/2020 |

OTHER PUBLICATIONS

Yang, G. et al., "Trusted Computing-Based Double Factor Authentication for Mobile Terminals", 2010 International Symposium on Intelligence Information Processing and Trusted Computing. IEEE Computer Society, Dec. 10, 2010, pp. 683-685.

JungHo Jin et al.: "Rollable Transparent Glass-Fabric Reinforced Composite Substrate for Flexible Devices," Advanced Materials, 22(40), 4510-4515. doi:10.1002/adma.201002198, Oct. 25, 2010, 6 pages.

Anonymous:"Filter capacitor Wikipedia," XP055695628, Aug. 19, 2012, retrieved from the Internet:URL:https:jjen.wikipedia.orgjwjindex. php?title=Filter capacitor&oldid=508192042 (retrieved on May 14, 2020), 3 pages.

* cited by examiner

FINGERPRINT IDENTIFICATION APPARATUS AND ELECTRONIC DEVICE

CROSS-REFERENCE TO RELATED APPLICATIONS

This application is a continuation of International Application No. PCT/CN2019/113720, filed on Oct. 28, 2019, which claims priority to International Application No. PCT/CN2018/120922, filed on Dec. 13, 2018, International Application No. PCT/CN2018/125425, filed on Dec. 29, 2018. All of the aforementioned patent applications are hereby incorporated by reference in their entireties.

TECHNICAL FIELD

The present application relates to the field of optical fingerprint technologies, and in particular, to a fingerprint identification apparatus and an electronic device.

BACKGROUND

At present, with the development of biometric sensors, especially the rapid development of fingerprint identification sensors, fingerprint identification sensors are widely applied to the fields of mobile terminal devices, smart homes, automotive electronics, and the like, and consumers' application of fingerprint sensors is more and more common.

With the continuous improvement of mobile terminal devices and mobile phone display screen technologies, materials of mobile terminal display screens are more and more diverse, roughly including a thin film field effect transistor liquid crystal display screen, a thin film diode semitransmissive liquid crystal display screen, an ultra fine bright (UFB) liquid crystal display screen, a super twisted Nematic (STN) liquid crystal display screen, an organic light-emitting diode (OLED) display screen, and a flexible folding screen. In addition, consumers have increasingly strict requirements on a size, thickness, and the like of a mobile terminal.

Therefore, how to adapt a fingerprint identification apparatus in a mobile terminal simultaneously to diverse screens and reduce a thickness of space for installation of the fingerprint identification apparatus under a screen to meet needs of the mobile terminal is a problem to be solved urgently.

SUMMARY

Embodiments of the present application provide a fingerprint identification apparatus and an electrode device, and the fingerprint identification apparatus could be configured to be disposed under a variety of different display screens, reducing a thickness of space for installation of the fingerprint identification apparatus under a screen.

In a first aspect, a fingerprint identification apparatus is provided and is configured to be disposed under a display screen of an electronic device, and includes: a support plate; and
    at least one fingerprint sensor chip, the at least one fingerprint sensor chip being disposed at an upper surface of the support plate;
    where the support plate is configured to be mounted to an upper surface of a middle frame of the electronic device so that the at least one fingerprint sensor chip is located under the display screen of the electronic device; and
    the at least one fingerprint sensor chip is configured to receive a fingerprint detecting signal returned by reflection or scattering via a human finger on the display screen, where the fingerprint detecting signal is used to detect fingerprint information of the finger.

Through a solution of an embodiment of the present application, a support plate is mounted to an upper surface of a middle frame of an electronic device so that at least one fingerprint sensor chip on the support plate is located under a display screen. In this case, a fingerprint identification apparatus is not fixedly connected to the display screen, but is fixedly installed in the middle frame of the electronic device, which is convenient for installation and removal of the fingerprint sensor chip, and suitable for any kind of display screen, and the fingerprint identification apparatus may be mounted at any position under the display screen. In addition, in the embodiment of the present application, thickness of the fingerprint identification apparatus is relatively small, and a thickness of space occupied by the fingerprint identification apparatus under the display screen is saved by mounting the fingerprint identification apparatus to the upper surface of the middle frame of the electronic device.

In some possible implementation manners, the upper surface of the middle frame extends downward and is provided with a groove or a through hole, a step structure is formed at an edge of the groove or an edge of the through hole, and an edge of the support plate overlaps an upper surface of the step structure.

In some possible implementation manners, the edge of the support plate bends upward to form an inverted step structure, and the inverted step structure is attached to the step structure.

In an embodiment of the present application, by designing a support plate as a special-shaped structure, an inverted step structure at an edge of the support plate overlaps and is fixed on a step structure of a middle frame, a central region of the support plate sinks while the support plate is fixed on the middle frame, and at least one fingerprint sensor chip is disposed on the central region. In other words, according to the solution of the embodiment of the present application, a fingerprint identification apparatus is embedded in a middle frame to a greater extent with a thickness of the middle frame, which further saves the thickness of space for installation of the fingerprint identification apparatus under a screen.

In some possible implementation manners, the upper surface of the middle frame extends downward and is provided with a groove or a through hole, and an edge of the support plate overlaps an edge of the groove or an edge of the through hole.

In some possible implementation manners, the edge of the support plate bends upward to form an inverted step structure, and the inverted step structure is attached to the edge of the groove or the edge of the through hole.

In some possible implementation manners, the inverted step structure is right-angled L-shaped or rounded-angled L-shaped, and a length of the inverted step structure is greater than 0.5 mm.

In some possible implementation manners, an upper surface of the inverted step structure and an upper surface of a peripheral region of the inverted step structure are located in a same plane.

In some possible implementation manners, a foam is provided between the inverted step structure and the at least one fingerprint sensor chip.

In some possible implementation manners, there is an air gap between a lower surface of a central region of the support plate and an upper surface of the groove.

In some possible implementation manners, a foam is provided between an upper surface of an edge of the support plate and a lower surface of the display screen.

In some possible implementation manners, the upper surface of the middle frame extends downward and is provided with a groove, and the support plate is fixed to an upper surface of the groove.

In some possible implementation manners, the support plate is fixed on the middle frame by glue, a solid adhesive or a foam.

In some possible implementation manners, the support plate is a stiffening steel sheet.

In some possible implementation manners, the support plate is a stiffening steel sheet of a flexible circuit board, and the flexible circuit board is electrically connected to the at least one fingerprint sensor chip.

In some possible implementation manners, the fingerprint identification apparatus further includes: the flexible circuit board, the flexible circuit board being electrically connected to the at least one fingerprint sensor chip by a gold wire.

In some possible implementation manners, a distance between the at least one fingerprint sensor chip and a lower surface of a light-emitting layer of the display screen is 150 µm to 2000 µm.

In some possible implementation manners, the at least one fingerprint sensor chip includes a plurality of optical fingerprint sensor chips, and the plurality of optical fingerprint sensor chips are arranged on the upper surface of the support plate side by side to be spliced into an optical fingerprint sensor chip component.

In some possible implementation manners, each of the at least one fingerprint sensor chip includes: a micro lens array, at least one light resisting layer and a light detection array; and the at least one light resisting layer is disposed under the micro lens array, where the at least one light resisting layer is provided with a plurality of light passing holes, and the light detection array is disposed under the at least one light resisting layer;

where the micro lens array is configured to converge the fingerprint detecting signal to the plurality of light passing holes of the at least one light resisting layer, and the fingerprint detecting signal is transmitted to the light detection array through the plurality of light passing holes.

In some possible implementation manners, the fingerprint identification apparatus further includes: a filter configured to filter out a light signal in a non-target wave band and transmit a light signal in a target wave band.

In some possible implementation manners, the filter is fixed on the at least one fingerprint sensor chip by an adhesive layer, or is integrated in the at least one fingerprint sensor chip.

In some possible implementation manners, the support plate and/or the middle frame is a structural member made of a metal material or plastic.

In some possible implementation manners, the display screen is an organic light-emitting diode screen, a liquid crystal display screen, or a flexible display screen.

In a second aspect, an electronic device is provided, including: a display screen, a middle frame, and the fingerprint identification apparatus according to the first aspect or any one of possible implementation manners of the first aspect, where the fingerprint identification apparatus is disposed under the display screen, and is mounted to an upper surface of the middle frame.

In some possible implementation manners, the upper surface of the middle frame extends downward and is provided with a groove, and the fingerprint identification apparatus is fixed in the groove.

In some possible implementation manners, the upper surface of the middle frame extends downward and is provided with a groove or a through hole, a step structure is formed at an edge of the groove or an edge of the through hole, the fingerprint identification apparatus includes a support plate, and an edge of the support plate overlaps an upper surface of the step structure.

In some possible implementation manners, the upper surface of the middle frame extends downward and is provided with a groove or a through hole, the fingerprint identification apparatus includes a support plate, and an edge of the support plate overlaps an edge of the groove or an edge of the through hole.

In some possible implementation manners, the display screen is an organic light-emitting diode screen, a liquid crystal display screen, or a flexible display screen.

In some possible implementation manners, the middle frame is a structural member made of metal or plastic.

By providing the above fingerprint identification apparatus in an electronic device, under-screen space of the electronic device is reduced, which is beneficial to the development of the electronic device to be lighter and thinner.

DESCRIPTION OF EMBODIMENTS

Technical solutions in embodiments of the present application will be described hereinafter with reference to the accompanying drawings.

It should be understood that embodiments of the present application may be applied to an optical fingerprint system, including but not limited to an optical fingerprint identification system and a product based on optical fingerprint imaging. The embodiments of the present application are described only by an example of an optical fingerprint system, which should not constitute any limitation to the embodiments of the present application, and the embodiments of the present application are also applicable to other systems using an optical imaging technology or the like.

As a common application scenario, a fingerprint identification system provided in an embodiment of the present application may be applied to a smart phone, a tablet computer, and another mobile terminal having a display screen or other electronic devices. More specifically, in the foregoing electronic device, a fingerprint identification apparatus may be specifically a fingerprint identification apparatus, which may be disposed in a partial region or an entire region under a display screen, thereby forming an under-screen (Under-display) optical fingerprint system. Alternatively, the fingerprint identification apparatus may be partially or entirely integrated into an interior of the display screen of the electronic device, thereby forming an in-screen (In-display) optical fingerprint system.

Figure 1:
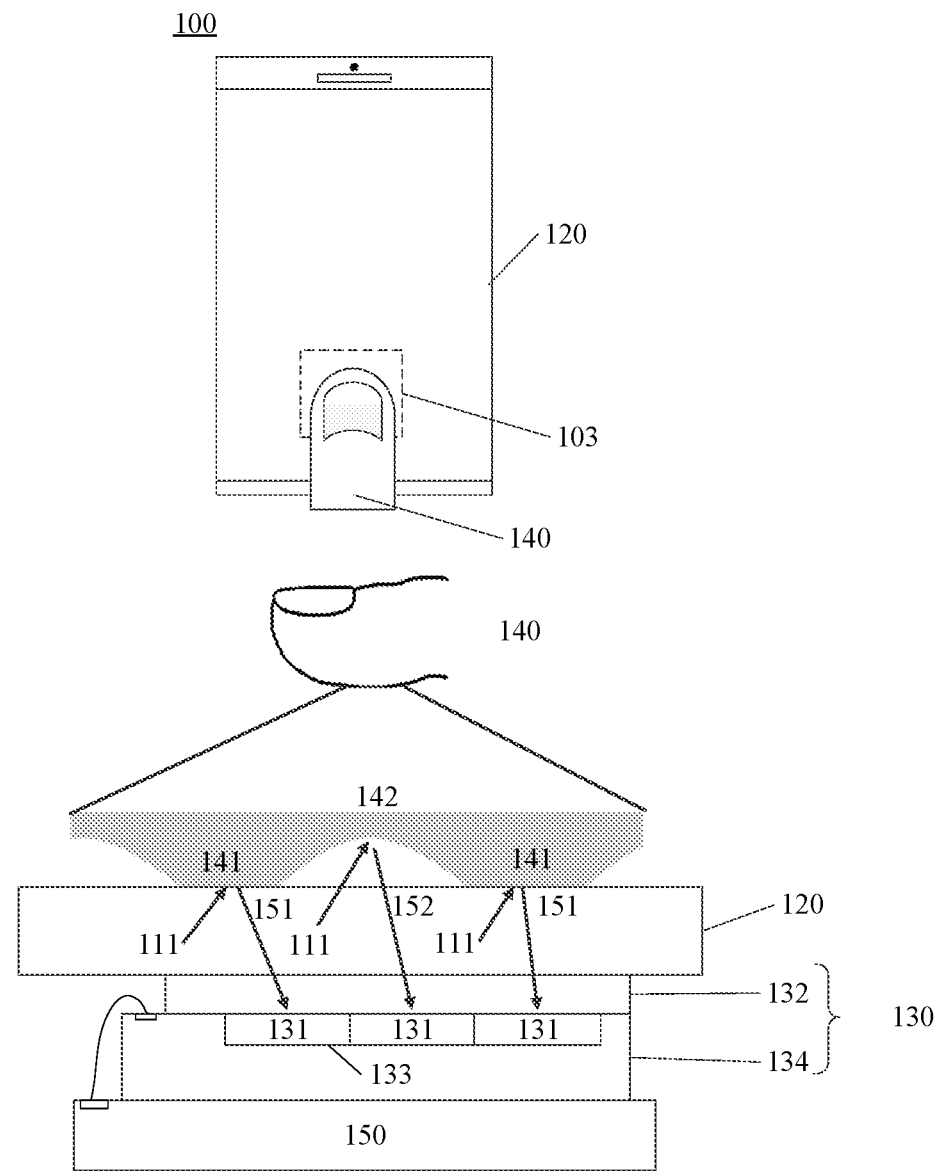
FIG. 1 is a schematic structural diagram of a terminal device applicable to an embodiment of the present application.

FIG. 1 shows a schematic structural diagram of a terminal device applicable to an embodiment of the present application. A terminal device 100 includes a display screen 120 and a fingerprint identification apparatus 130, where the fingerprint identification apparatus 130 is disposed in a partial region under the display screen 120. The fingerprint identification apparatus 130 includes an optical fingerprint sensor including a sensing array 133 having a plurality of optical sensing units 131, and a region where the sensing array 133 is located or its sensing region is a fingerprint detecting region 103 of the fingerprint identification apparatus 130. As shown in FIG. 1, the fingerprint detecting region 103 is located in a display region of the display screen 120. In an alternative embodiment, the fingerprint identification apparatus 130 may also be disposed at another position, such as a side of the display screen 120 or an non-light-transmitting region of an edge of the terminal device 100, and a light signal from at least part of the display region of the display screen 120 is directed to the fingerprint identification apparatus 130 through a light path design, so that the fingerprint detecting region 103 is actually located in the display region of the display screen 120.

It should be understood that an area of the fingerprint detecting region 103 may be different from an area of the sensing array of the fingerprint identification apparatus 130. For example, the area of the fingerprint detecting region 103 of the fingerprint identification apparatus 130 may be larger than the area of the sensing array of the fingerprint identification apparatus 130 through for example, a lens imaging light path design, a reflective folding light path design or other light path designs such as light convergence or reflection. In other alternative implementation manners, if a light path is directed in a manner of light collimation for example, the area of the fingerprint detecting region 103 of the fingerprint identification apparatus 130 may also be designed to be substantially identical with the area of the sensing array of the fingerprint identification apparatus 130.

Therefore, when a user needs to unlock an electronic device or perform other fingerprint verification, a fingerprint input can be implemented merely by pressing a finger on the fingerprint detecting region 103 in the display screen 120. Since fingerprint detection may be implemented in the screen, there is no need to exclusively reserve space for a front surface of the terminal device 100 in the foregoing structure to set a fingerprint button (such as a Home button), so that a full screen solution may be adopted; that is, the display region of the display screen 120 may be substantially extended to an entire front surface of the terminal device 100.

As an optional implementation manner, as shown in FIG. 1, the fingerprint identification apparatus 130 includes a light detecting portion 134 and an optical component 132. The light detecting portion 134 includes the sensing array, and a readout circuit electrically connected to the sensing array 133 and other auxiliary circuits, and may be fabricated on a die such as on an optical imaging chip or an optical fingerprint sensor by a semiconductor process. The sensing array is specifically a photo detector array including a plurality of photo detectors distributed in an array, and the photo detectors may serve as the optical sensing units as described above. The optical component 132 may be disposed above the sensing array of the light detecting portion 134, and may specifically include a light directing layer or a light path directing structure, and other optical elements. The light directing layer or the light path directing structure is mainly used to direct reflected light reflected from a finger surface to the sensing array for optical detection.

In a specific implementation, the optical component 132 and the light detecting portion 134 may be encapsulated in the same optical fingerprint component. For example, the optical component 132 and the light detecting portion 134 may be encapsulated in the same optical fingerprint chip, or the optical component 132 may be disposed outside a chip where the light detecting portion 134 is located, for example, the optical component 132 is attached to the chip, or some elements of the optical component 132 are integrated into the chip.

The light directing layer or the light path directing structure of the optical component 132 has various implementations. For example, the light directing layer may be specifically a collimator layer fabricated on a semiconductor silicon wafer, which has a plurality of collimating units or a micro hole array, and the collimating units may be specifically small holes. Among reflected light reflected back from a finger, light that is vertically incident to the collimating unit may pass through the collimating unit and be received by an optical sensing unit under the collimating unit, and light with an overlarge incident angle is attenuated through multiple reflections inside the collimating unit. Therefore, each optical sensing unit may basically only receive reflected light reflected back from a fingerprint pattern right above the optical sensing unit, and thus the sensing array may detect a fingerprint image of the finger.

In another embodiment, the light directing layer or the light path directing structure may also be an optical lens layer having one or more lens units, for example, a lens group composed of one or more aspheric lenses, for converging reflected light reflected back from a finger to the sensing array of the light detecting portion 134 under the optical lens layer, so that the sensing array may perform imaging based on the reflected light so as to obtain a fingerprint image of the finger. Optionally, the optical lens layer may further be provided with a pinhole formed in a light path of the lens unit, and the pinhole may cooperate with the optical lens layer to expand the field of view of the fingerprint identification apparatus to improve a fingerprint imaging effect of the fingerprint identification apparatus 130.

In other embodiments, the light directing layer or the light path directing structure may also specifically adopt a micro lens layer having a micro lens array formed by a plurality of micro lenses, which may be provided above the sensing array of the light detecting portion 134 by a semiconductor growth process or other processes, and each micro lens may correspond to one of the sensing units in the sensing array, respectively. Moreover, another optical film layer such as a medium layer or a passivation layer may be provided between the micro lens layer and the sensing units. More specifically, a light shielding layer having micro holes may further be provided between the micro lens layer and the sensing units, where a micro hole is provided between a corresponding micro lens and a corresponding sensing unit, and the light shielding layer may shield optical interference between adjacent micro lenses and sensing units so that light corresponding to the sensing unit is converged to an interior of the micro hole through the micro lens and transmitted to the sensing unit via the micro hole for optical fingerprint imaging. It should be understood that the forgoing several implementations for a light path directing structure may be used alone or in combination. For example, a micro lens layer may be further disposed under the collimator layer or the optical lens layer. Certainly, when the collimator layer or the optical lens layer is used in combination with the micro lens layer, the specific laminated structure or light path may require to be adjusted according to actual needs.

As an optional embodiment, the display screen 120 may adopt a display screen with a self-light-emitting display unit, for example, an organic light-emitting diode (OLED) display screen or a micro light-emitting diode (Micro-LED) display screen. In an example of an OLED display screen, the fingerprint identification apparatus 130 may use a display unit (that is, an OLED light source) of the OLED display screen 120 located in the fingerprint detecting region 103 as an excitation light source for optical fingerprint detection. When a finger 140 is pressed against the fingerprint detecting region 103, the display screen 120 emits a beam of light 111 to the target finger 140 above the fingerprint detecting region 103, and the light 111 is reflected by a surface of the finger 140 to form reflected light or scattered inside the finger 140 to form scattered light. In related patent applications, the foregoing reflected light and scattered light are collectively referred to as reflected light for convenience of description. Since a ridge and a valley of a fingerprint have different light reflecting capabilities, reflected light 151 from the ridge of the fingerprint and reflected light 152 from the valley of the fingerprint have different light intensities. After passing through the optical component 132, the reflected light is received by the sensing array 133 in the fingerprint identification apparatus 130 and converted into a corresponding electrical signal, that is, a fingerprint detecting signal; and fingerprint image data may be obtained based on the fingerprint detecting signal, and fingerprint matching verification may be further performed, thereby implementing an optical fingerprint identification function in the terminal device 100.

In other embodiments, the fingerprint identification apparatus 130 may also use an internal light source or an external light source to provide a light signal for fingerprint detection. In this case, the fingerprint identification 130 may apply to a non-self-light-emitting display screen, such as a liquid crystal display screen or anther passive light-emitting display screen. In an example of application to a liquid crystal display screen having a backlight module and a liquid crystal panel, in order to support under-screen fingerprint detection of the liquid crystal display screen, an optical fingerprint system of the terminal device 100 may further include an excitation light source for optical fingerprint detection. The excitation light source may be specifically an infrared light source or a light source of non-visible light at a specific wavelength, which may be disposed under the backlight module of the liquid crystal display screen or disposed in an edge region under a protective cover of the terminal device 100. The fingerprint identification apparatus 130 may be disposed under the liquid crystal panel or an edge region of the protective cover, and by being directed over a light path, light for fingerprint detection may reach the fingerprint identification apparatus 130. Alternatively, the fingerprint identification apparatus 130 may also be disposed under the backlight module, and the backlight module allows the light for fingerprint detection to pass through the liquid crystal panel and the backlight module and reach the fingerprint identification apparatus 130 by providing an opening on film layers such as a diffusion sheet, a brightening sheet, a reflection sheet or the like, or by other optical designs. When the fingerprint identification apparatus 130 provides a light signal for fingerprint detection by adopting an internal light source or an external light source, a detection principle is consistent with the foregoing description.

It should be understood that, in a specific implementation, the terminal device 100 further includes a transparent protective cover; and the cover may be a glass cover or a sapphire cover, which is located above the display screen 120 and covers a front surface of the terminal device 100. Therefore, in an embodiment of the present application, the so-called finger being pressed against the display screen 120 actually refers to the finger being pressed against the cover above the display screen 120 or a surface of a protective layer covering the cover.

It should also be understood that the terminal device 100 may further include a circuit board 150, and the circuit board is disposed under the fingerprint identification apparatus 130. The fingerprint identification apparatus 130 may be bonded to the circuit board 150 by a backside adhesive, and achieve electrical connection with the circuit board 150 by welding of a pad and a metal wire. The fingerprint identification apparatus 130 may achieve electrical interconnection and signal transmission with other peripheral circuits or other elements of the terminal device 100 through the circuit board 150. For example, the fingerprint identification apparatus 130 may receive a control signal of a processing unit of the terminal device 100 through the circuit board 150, and may also output the fingerprint detecting signal from the fingerprint identification apparatus 130 to the processing unit, a control unit or the like of the terminal device 100 through the circuit board 150.

On the other hand, in some embodiments, the fingerprint identification apparatus 130 may only include one optical fingerprint sensor, and in this case, the fingerprint detecting region 103 of the fingerprint identification apparatus 130 has a smaller area and a fixed position, and therefore, when a fingerprint input is performed, the user needs to press the finger at a specific position of the fingerprint detecting region 103, otherwise the fingerprint identification apparatus 130 may not be able to capture the fingerprint image, thereby resulting in poor user experience. In other alternative embodiments, the fingerprint identification apparatus 130 may specifically include a plurality of optical fingerprint sensors. The plurality of optical fingerprint sensors may be disposed under the display screen 120 side by side in a splicing manner, and sensing regions of the plurality of optical fingerprint sensors collectively constitute the fingerprint detecting region 103 of the fingerprint identification apparatus 130. That is, the fingerprint detecting region 103 of the fingerprint identification apparatus 130 may include a plurality of sub-regions, each sub-region corresponding to a sensing region of one of the optical fingerprint sensors respectively, so that a fingerprint capturing region 103 of the fingerprint identification apparatus 130 may extend to a main region of a lower half part of the display screen, that is, to a region generally pressed against by the finger, thereby implementing a blind pressing type of fingerprint input operation. Alternatively, when the number of the optical fingerprint sensors is sufficient, the fingerprint detecting region 103 may also extend to a half of the display region or even the entire display region, thereby achieving half-screen or full-screen fingerprint detection.

It should also be understood that in the embodiment of the present application, the sensing array in the fingerprint identification apparatus may also be referred to as a pixel array, and the optical sensing units or sensing units in the sensing array may also be referred to as pixel units.

It should be noted that the fingerprint identification apparatus in the embodiment of the present application may also be referred to as an optical fingerprint identification module, an optical fingerprint identification apparatus, a fingerprint identification module, a fingerprint module, a fingerprint capturing apparatus, or the like, and the foregoing terms may be replaced with each other.

It should be understood that although the embodiment shown in FIG. 1 is described by an example that the optical fingerprint identification apparatus is an under-screen optical fingerprint identification apparatus, in other embodiments, the fingerprint identification apparatus of the terminal device 100 may also be replaced with an ultrasonic fingerprint identification apparatus or other types of fingerprint identification apparatuses. The type and specific structure of the fingerprint identification apparatus are not specifically limited in the present application, as long as the forgoing fingerprint identification apparatus could meet performance requirements for performing fingerprint identification in an interior of the display screen of the terminal device.

The fingerprint identification apparatus in the embodiment of the present application could reduce a thickness of space occupied by the fingerprint identification apparatus and is applicable under various display screens, which further improves the overall performance of the fingerprint identification apparatus and the electronic device where it is located and user experience.

A fingerprint identification apparatus according to an embodiment of the present application will be described hereinafter in detail with reference to FIG. 2 to FIG. 13.

It should be noted that in embodiments illustrated below, the same structures are denoted by the same reference numeral for ease of understanding, and detailed description of the same structures is omitted for brevity.

Figure 2:
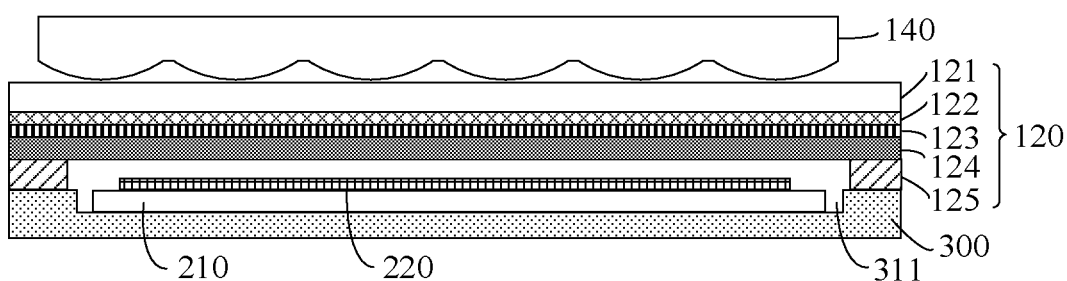
FIG. 2 is a schematic structural diagram of a fingerprint identification apparatus according to an embodiment of the present application.

FIG. 2 is a schematic structural diagram of a fingerprint identification apparatus 200 provided in an embodiment of the present application. The fingerprint identification apparatus 200 is configured to be disposed under a display screen of an electronic device, where the display screen may be any kind of display screen, for example, a liquid crystal display screen, an organic light-emitting diode display screen, or a flexible display screen.

As shown in FIG. 2, the fingerprint identification apparatus 200 includes:
   a support plate 210; and
   at least one fingerprint sensor chip 220, the at least one fingerprint sensor chip 220 being disposed at an upper surface of the support plate 210;
   where the support plate 210 is configured to be mounted to an upper surface of a middle frame 300 of the electronic device so that the at least one fingerprint sensor chip 220 is located under a display screen 120 of the electronic device; and
   the at least one fingerprint sensor chip 220 is configured to receive a fingerprint detecting signal returned by reflection or scattering via a human finger on the display screen 120, where the fingerprint detecting signal is used to detect fingerprint information of the finger.

Optionally, in the embodiment of the present application, the support plate 210 may be various materials that are not easily deformed. For example, the support plate 210 may be a support plate made of a metal material or a support plate made of an alloy material, or may be a support plate made of a plastic package material, as long as it has a definite shape and functions of support and fixation, which is not limited in the embodiment of the present application.

Optionally, the support plate 210 may have a regular shape structure such as a polygon, a circle, or may have another irregular shape structure, which is not specifically limited in the embodiment of the present application.

Optionally, surface roughness of the support plate 210 is measured by a contour arithmetic mean deviation (Ra), and the Ra of the support plate 210 is greater than a certain threshold, such as 0.25 μm, to improve an imaging effect. Specifically, when the surface roughness of the support plate 210 is greater than a certain threshold, its surface may scatter light signals, which could effectively reduce light signals that are emitted from the display screen 120 and reflected inside the fingerprint identification apparatus 200, and further avoid the influence of light reflection on imaging. In addition, when the surface roughness of the support plate 210 is greater than a certain threshold, reliability of connection between the support plate 210 and other components may be increased, such as reliability of connection between the support plate 210 and the at least one fingerprint chip 220.

Optionally, a thickness of the support plate 210 ranges from 0.15 mm to 0.30 mm to control a thickness of the fingerprint identification apparatus 200.

Optionally, planeness of the support plate 210 is less than a certain threshold, such as 0.03 mm. Specifically, planeness of a connection region between the at least one fingerprint sensor chip 220 and the support plate 210 is less than 0.03 mm to ensure reliability of connection between the at least one fingerprint sensor chip 220 and the support plate 210.

Figure 3:
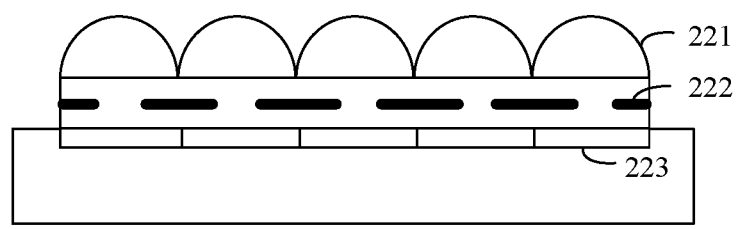
FIG. 3 is a schematic structural diagram of a fingerprint sensor chip according to an embodiment of the present application.

Optionally, as shown in FIG. 3, each of the at least one fingerprint sensor chip 220 may include: a micro lens array 221, at least one light resisting layer 222 and a light detection array 223; and
   the at least one light resisting layer 222 is disposed under the micro lens array 221, where the at least one light resisting layer is provided with a plurality of light passing holes, and the light detection array 223 is disposed under the at least one light resisting layer 222; where the foregoing micro lens array 221 is configured to converge the fingerprint detecting signal to the plurality of light passing holes of the at least one light resisting layer 222, and the fingerprint detecting signal is transmitted to the light detection array 223 through the plurality of light passing holes.

The foregoing light detection array 223 includes a plurality of sensing units. A sensing unit is configured to receive a fingerprint light signal returned after being reflected or scattered via a finger and process the light signal to obtain a fingerprint image unit, and the fingerprint image unit is a unit pixel in a fingerprint image. Optionally, the sensing unit may include elements such as a photo diode (PD), a metal oxide semiconductor field effect transistor (MOSFET). Optionally, the sensing unit has high light sensitivity and high quantum efficiency for light at a specific wavelength, so as to detect a light signal at a corresponding wavelength. It should be understood that the light detection array 223 in FIG. 3 may also be the sensing array 133 in FIG. 1, and description of its related function and structure may refer to the foregoing related description.

In the embodiment of the present application, the foregoing at least one light resisting layer 222 may shield optical interference between adjacent micro lenses and sensing units so that a fingerprint detecting signal corresponding to a sensing unit is converged to an interior of a light passing hole through a micro lens and transmitted to a sensing unit via the light passing hole for optical fingerprint imaging. Optionally, a transparent medium layer isolates the light detection array 223 from the at least one light resisting layer 222, and isolates a plurality of light resisting layers 222 from each other.

The foregoing micro lens array 221 are formed by a plurality of micro lenses, which may be provided on the at least one light resisting layer 222 by a semiconductor growth process or other processes, and each micro lens may correspond to one of the sensing units in the light detection array 223, respectively.

With the fingerprint sensor chip according to the embodiment of the present application, a thickness of an optical fingerprint identification sensor is reduced while identification of a fingerprint image in a large area with high resolution is implemented, thereby improving performance of the optical fingerprint identification apparatus.

Optionally, the at least one fingerprint sensor chip 220 may be disposed at the upper surface of the support plate by an adhesive layer. For example, the adhesive layer is a die attach film (DAF), which may implement ultrathin connection between the at least one fingerprint sensor chip 220 and the support plate 210.

Further, the support plate 210 is mounted to the upper surface of the middle frame 300 of the electronic device so that the at least one fingerprint sensor chip 220 on the support plate 210 is located under the display screen 120. Specifically, windowing is performed on part of a laminated structure in the display screen 120 so that the fingerprint detecting signal above the display screen could enter the at least one fingerprint sensor chip 220 through the window, and the at least one fingerprint sensor chip 220 is located under the window.

Specifically, FIG. 2 shows a schematic structure diagram of an OLED display screen. As shown in FIG. 2, the display screen 120 may include a light-emitting layer 124 and a light-blocking and heat-dissipating cushion layer 125.

A light-blocking and heat-dissipating protective layer 125 is disposed under a display component 124, and provided with a window therein. The light-blocking and heat-dissipating protective layer may be a black sheet-like layer or a print layer for shielding light, includes at least a part of metal material for heat dissipation, and may further include a foam layer to play a role of cushioning and protection.

There may be a gap between the at least one fingerprint sensor chip 220 in the fingerprint identification apparatus 220 and a lower surface of the light-emitting layer 124. The gap may be an air gap that is not filled with any auxiliary material, which could ensure that the fingerprint sensor chip 220 will not be in contact with the light-emitting layer 124 when the display screen is pressed or the electronic device falls or collides, and the display effect of the display screen and stability and performance of fingerprint identification for the fingerprint sensor chip 220 are not affected.

The light-emitting layer 124 may be an OLED organic light-emitting panel manufactured by a low temperature poly-silicon (LTPS) technology, and it is ultrathin in thickness, light in weight and low in power consumption and may be used to provide clearer images. When there is a gap between the fingerprint sensor chip 220 and the light-emitting layer 124, the gap may be less than or equal to a preset threshold, and the preset threshold may be between 150 μm and 2000 μm.

Optionally, as shown in FIG. 2, the display screen 120 may further include a polarizer (POL) 123 disposed above the light-emitting layer for generating polarized light. A touch sensor layer (Touch Panel Sensor, TP Sensor) 122 is disposed above the polarizer 123 for sensing and detecting a touch of a finger on the display screen. Specifically, as shown in FIG. 2, the display screen 120 may further include a cover glass 121 for protecting the display screen 120, and the touch sensor layer 122 specifically detects a touch of a finger on the cover glass 121.

Optionally, the cover glass 121 and the touch sensor layer 122, and/or the touch sensor layer 122 and the polarizer 123 may be attached by an optically clear adhesive (OCA).

It should be noted here that when the display screen 120 is an LCD display screen, the LCD display screen also includes its corresponding light-emitting layer and light-blocking and heat-dissipating protective layer, where the light-emitting layer of the LCD displays screen is a liquid crystal light-emitting layer, and the light-blocking and heat-dissipating protective layer is a light-blocking protective structure under the LCD display screen. When the fingerprint identification apparatus is disposed under the LCD display screen, it is also necessary to perform windowing on the light-blocking protective structure in the LCD display screen to pass a light signal above the display screen.

Similarly, when the display screen 120 is a flexible display screen, the flexible display screen may be a flexible LCD display screen or a flexible OLED display screen. The specific solution may refer to the above description, and will not be repeated redundantly herein.

Through the solution of the embodiment of the present application, the support plate 210 is mounted to the upper surface of the middle frame 300 of the electronic device so that the at least one fingerprint sensor chip 220 on the support plate 210 is located under the display screen 120. In this case, the fingerprint identification apparatus 200 is not fixedly connected to the display screen 120, but is fixedly installed in the middle frame 300 of the electronic device, which is convenient for installation and removal of the fingerprint sensor chip 220, and suitable for any kind of display screen 120, and the fingerprint identification apparatus 200 may be mounted at any position under the display screen 120.

In addition, in the embodiment of the present application, thickness of the fingerprint identification apparatus 200 is relatively small, and a thickness of space occupied by the fingerprint identification apparatus 200 under the display screen is saved by mounting the fingerprint identification apparatus 200 to the upper surface of the middle frame 300 of the electronic device.

Optionally, in the embodiment of the present application, the at least one fingerprint sensor chip 220 may be a single fingerprint sensor chip, or may include a plurality of fingerprint sensor chips. The fingerprint sensor chip may include the foregoing optical component 132 and light detecting portion 134, and be configured to receive and transmit a fingerprint light signal after being reflected or scattered via a finger and convert the fingerprint light signal into a fingerprint electrical signal. Both the fingerprint light signal and the fingerprint electrical signal are fingerprint detecting signals for fingerprint identification.

Figure 4:
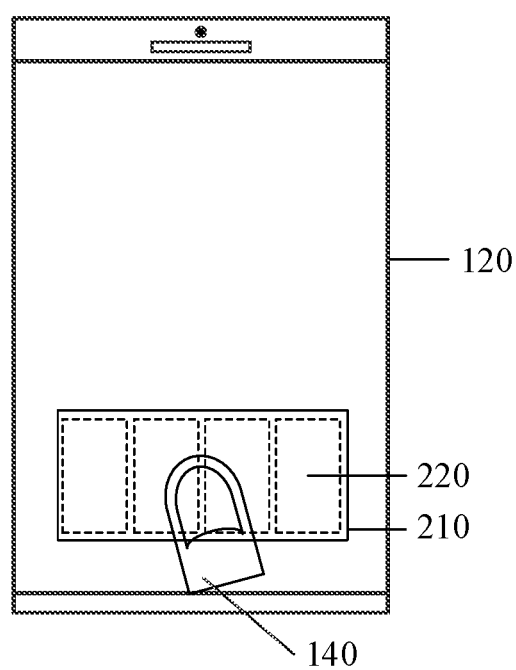
FIG. 4 is a schematic top view of a fingerprint identification apparatus according to an embodiment of the present application.

For example, for a fingerprint sensor array composed of four fingerprint sensor chips shown in FIG. 4, the four fingerprint sensor chips may be arranged under a middle region of the display screen 120 side by side in a splicing manner and disposed at the upper surface of the support plate 210 to form an optical fingerprint sensor chip component, and sensing regions of the four optical fingerprint sensor chips collectively constitute the fingerprint detecting region of the fingerprint identification apparatus 200.

It should be understood that the number, size, and arrangement of the fingerprint sensor chips shown in the drawing are only examples, and can be adjusted according to actual needs. For example, the number of the plurality of fingerprint sensor chips may be any number such as two, three, or five, and the plurality of the fingerprint sensor chips may be distributed in any manner such as in a rectangular or circular shape, which are not limited in the embodiment in the present application.

Optionally, in one possible implementation manner, as shown in FIG. 2, the upper surface of the middle frame 300 extends downward and is provided with a groove 311, and the support plate 210 is disposed at a surface of the groove 311. Optionally, a depth of the groove 311 is greater than or equal to a thickness of the support plate 210, and the fingerprint identification apparatus 200 is fully or partially embedded in the middle frame 300, thereby further reducing a thickness of under-screen space occupied by the fingerprint identification apparatus 200 with a thickness of the middle frame 300.

Optionally, the support plate 210 may be installed and fixed in the groove by an adhesive layer or a mechanical fixing device, or other types of fixing devices. For example, the support plate 210 is connected to the groove 311 of the middle frame by a module attaching double-sided adhesive (Fingerprint Module Tape), and two sides of the module attaching double-sided adhesive are respectively bonded to an upper surface of the groove 311 and a lower surface of the support plate 210.

For another example, the support plate 210 may be bonded to the groove 311 of the middle frame by glue, a solid adhesive, or a foam with an adhesive layer.

Figure 5:
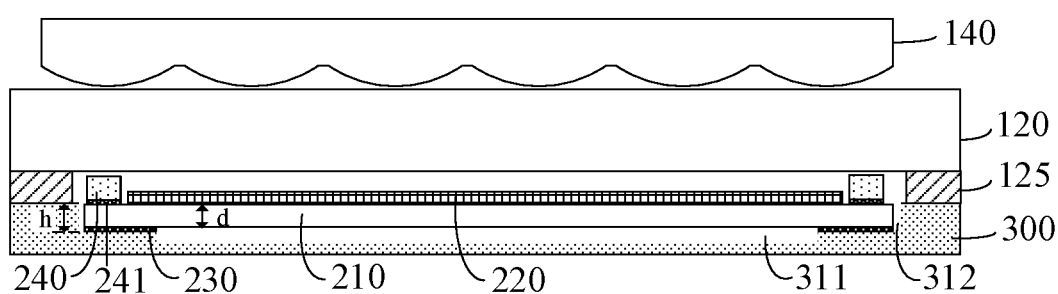
FIG. 5 is a schematic structural diagram of another fingerprint identification apparatus according to an embodiment of the present application.

FIG. 5 shows an installation structural diagram of another fingerprint identification apparatus 200 located under a display screen 120.

As shown in FIG. 5, a step structure 312 is formed at an edge of a groove 311, and an edge of a support plate 210 overlaps an upper surface of the step structure 312.

Optionally, in the embodiment of the present application, a depth of the groove 311 is greater than a thickness of the support plate 210, and a height of the step structure 312 is greater than or equal to the thickness of the support plate 210.

Optionally, as shown in FIG. 5, an upper surface of the support plate 210 may be on the same level as an upper surface of another region of the middle frame 300 except the groove, and in this case, a height h of the step structure 312 may be equal to a thickness d of the support plate 210.

Optionally, as shown in FIG. 5, a lower surface of the edge of the support plate 210 and the upper surface of the step structure 312 are connected and fixed at the overlap by an adhesive layer 230. Optionally, the adhesive layer 230 may also be a module attaching double-sided adhesive, glue, a solid adhesive, a foam layer with an adhesive layer, or another type of adhesive layer, which is not limited in the embodiment of the present application.

Optionally, in this case, there is a certain distance between a lower surface of a central region of the support plate 210 and an upper surface of the groove, and the gap distance can be used to accommodate other parts of an electronic devices, which improves utilization of under-screen space. Moreover, with this embodiment, the middle frame does not need to provide support for all regions of the support plate, only needs to provide support and fixation for part of edges of the support plate, which is convenient for installation and removal of the fingerprint identification apparatus 200, reduces a thickness of the middle frame under the fingerprint identification apparatus, further reduces the under-screen space of the electronic device, and is beneficial to the development of the electronic device to be lighter and thinner.

Optionally, as shown in FIG. 5, a foam 240 is provided between an upper surface of the edge of the support plate 210 and a lower surface of the display screen.

Optionally, the foam 240 may be provided in all or partial regions of peripheral edges of the support plate 210. Optionally, the foam 240 may be in a frame shape, a bar shape, a block shape or any other shapes.

Optionally, as shown in FIG. 5, a lower surface of the foam 240 is attached with a foam attaching adhesive 241, and the foam 240 is bonded to the upper surface of the support plate 210 by the foam attaching adhesive 241. In this case, an upper surface of the foam 240 is close to the lower surface of the display screen 120, and may be in contact with the lower surface of the display screen 120, or there may be a certain air gap between the upper surface of the foam 240 and the lower surface of the display screen 120.

Optionally, the foam attaching adhesive 241 may be provided on the upper surface of the foam 240, and the foam 240 is bonded to the lower surface of the display screen 120 by the foam attaching adhesive 241, for example, to a lower surface of a light-emitting layer 124 in the display screen 120. In this case, the lower surface of the foam 240 is close to the upper surface of the support plate 210, and may be in contact with the upper surface of the support plate 210, or there may be a certain air gap between the lower surface of the foam 240 and the upper surface of the support plate 210.

Optionally, the foam attaching adhesive may be provided on the upper and lower surfaces of the foam 240 at the same time, and the foam 240 is bonded to the display screen 120 and the support plate 210 by the foam attaching adhesive 241.

When the display screen 120 is a flexible display screen, by providing the foam 240 between the upper surface of the edge of the support plate 210 and the lower surface of the display screen, when the finger is pressed against the flexible display screen, the foam 240 may be used to cushion a press force of the finger, and plays a role of supporting the flexible display screen, thereby reducing the influence of the press of the finger on the display effect of the flexible display screen.

Figure 6:
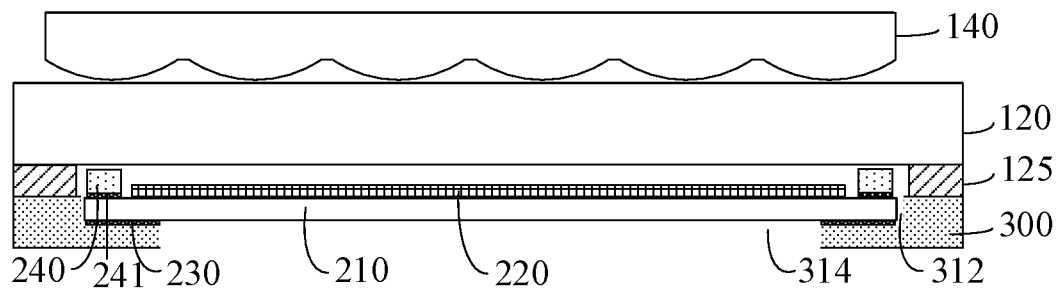
FIG. 6 is a schematic structural diagram of another fingerprint identification apparatus according to an embodiment of the present application.

Optionally, in another possible embodiment, as shown in FIG. 6, a middle frame 300 is provided with a through hole 314, and a step structure 312 is formed at an edge of the through hole 314. An edge of a support plate 210 overlaps an upper surface of the step structure 312. Similarly, a lower surface of the edge of the support plate 210 and the upper surface of the step structure 312 are connected and fixed at the overlap by an adhesive layer 230.

Optionally, as shown in FIG. 6, a foam 240 may also be provided between an upper surface of the edge of the support plate 210 and a lower surface of a display screen. The technical solution related to the foam 240 may refer to the related description of the foam 240 in FIG. 5 above, and will not be repeated redundantly herein.

In the embodiment of the present application, the fingerprint identification apparatus 200 only occupies a small partial region of the middle frame for fixation, a region under the fingerprint identification apparatus may be used to accommodate other components in the electronic device, for example, to place parts such as a battery, a main board, a camera, wires, various sensors, a microphone, and an earphone. In this case, a thickness of the middle frame under the fingerprint identification apparatus may be minimized.

Figure 7:
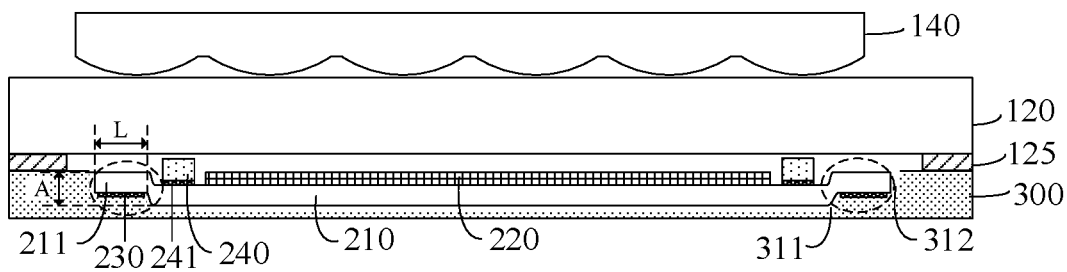
FIG. 7 is a schematic structural diagram of another fingerprint identification apparatus according to an embodiment of the present application.

FIG. 7 shows an installation structural diagram of another fingerprint identification apparatus 200 located under a display screen 120.

As shown in FIG. 7, a support plate 210 is a special-shaped support plate, an edge of which bends upward to form an inverted step structure 211, and the inverted step structure 211 overlaps a step structure 312 of a middle frame 300. An upper surface of the inverted step structure 211 is higher than an upper surface of a central region of the support plate 210, and a lower surface of the inverted step structure 211 is attached to an upper surface of the step structure 312 of the middle frame 300.

Optionally, as shown in FIG. 7, the lower surface of the foregoing inverted step structure 211 and the upper surface of the step structure 312 may be bonded and fixed by an adhesive layer 230.

In the embodiment of the present application, at least one fingerprint sensor chip 220 is disposed in the central region of the support plate 210 instead of an edge region. In other words, the at least one fingerprint sensor chip 220 is not located on the upper surface of the inverted step structure 211 of the support plate 210.

Optionally, as shown in FIG. 7, a height of the inverted step structure 211, that is, a distance A between the upper surface of the inverted step structure 211 and a lower surface of the support plate 210, is less than or equal to a depth of a groove 311 of the middle frame.

Optionally, when the height A of the inverted step structure 211 is equal to the depth of the groove 311, a lower surface of another region of the support plate 210 except the inverted step structure 211 may be attached to an upper surface of the groove 311 in the middle frame. For example, a lower surface of the central region of the support plate or a projection region of the at least one fingerprint sensor chip 220 on the support plate 210 may be attached to the upper surface of the groove 311. Optionally, the lower surface of another region may also be bonded to the upper surface of the groove 311 in the middle frame by the adhesive layer 230.

Optionally, as shown in FIG. 7, when the height A of the inverted step structure 211 is less than the depth of the groove 311, there may also be a certain air gap between the lower surface of another region of the support plate 210 except the inverted step structure 211 and the upper surface of the groove 311 in the middle frame. For example, there may be a certain air gap between the lower surface of the projection region of the at least one fingerprint identification chip 220 on the support plate 210 and the upper surface of the groove 311.

Optionally, the upper surface of the inverted step structure 211 may be lower than an upper surface of another region of the middle frame expect the groove 311, or the upper surface of the inverted step structure 211 may be located on the same level as an upper surface of another region of the middle frame except the groove 311, such as a peripheral region of the step structure 312 in the middle frame.

Further, an upper surface of the at least one fingerprint sensor chip 220 on the support plate may also be located on the same level as the upper surface of another region of the middle frame except the groove 311, or may be lower than the upper surface of another region of the middle frame except the groove 311.

Optionally, as shown in FIG. 7, a length L of the inverted step structure 211 is greater than a certain threshold to achieve stable support for the fingerprint identification apparatus 200. For example, the length L of the inverted step structure 211 may be greater than 0.5 mm. For example, the length L of the inverted step structure 211 is 1 mm.

Specifically, the length of the inverted stepped structure 211 is related to a thickness and material strength of the support plate 210 in an actual product. The inverted stepped structure 211 is designed to be able to stably support the support plate 210 and the at least one fingerprint sensor chip 220 on the support plate 210 on the middle frame 300. Optionally, when the thickness of the support plate 210 is greater, the length of the inverted step structure 211 is longer, so as to provide more stable support. Optionally, when the strength of the support plate 210 is stronger, the length of the inverted step structure 211 may be appropriately reduced, which further reduces space occupied by the inverted step structure 211 on the premises of provision of stable support.

In the embodiment of the present application, by designing the support plate 210 as a special-shaped structure, the inverted step structure at the edge of the support plate 210 overlaps and is fixed to the step structure of the middle frame, the central region of the support plate, that is, a region where the upper surface of the support plate is provided with at least one fingerprint sensor, is located inside the middle frame while the support plate is fixed to the middle frame. In other words, according to the solution of the embodiment of the present application, the fingerprint identification apparatus 200 is embedded in the middle frame to a greater extent with the thickness of the middle frame, which further saves a thickness of space under the screen.

Figure 8:
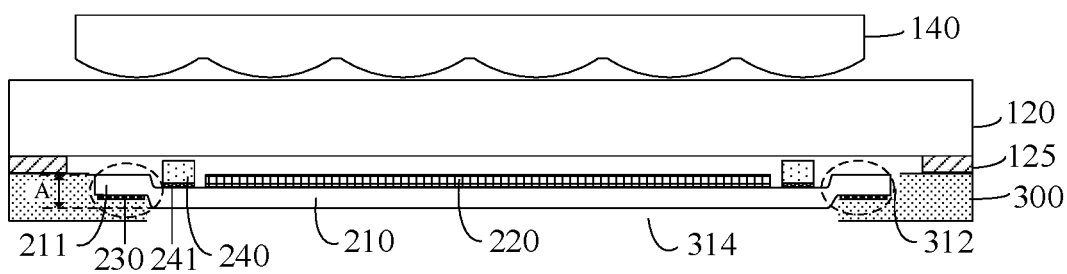
FIG. 8 is a schematic structural diagram of another fingerprint identification apparatus according to an embodiment of the present application.

Particularly, as shown in FIG. 8, when the middle frame 300 is not provided with the groove 311, but provided with a through hole 314, the through hole 314 is provided with a step structure 312 that may also be formed at the edge of the upper surface of the middle frame, an inverted step structure 211 at the edge of the special-shaped support plate 210 may also overlap the step structure 312 of the middle frame 300, and the lower surface of the foregoing inverted step structure 211 and the upper surface of the step structure 312 are bonded and fixed by the adhesive layer 230.

Optionally, an upper surface of the inverted step structure 211 may be lower than an upper surface of another region of the middle frame expect the through hole 314, or an upper surface of the inverted step structure 211 may be located on the same level as an upper surface of another region of the middle frame except the through hole 314.

Further, the upper surface of the at least one fingerprint sensor chip 220 on the support plate may also be located on the same level as the upper surface of another region of the middle frame except the through hole 314, or may be lower than the upper surface of another region of the middle frame except the through hole 314.

In this case, while the fingerprint identification apparatus 200 is embedded in the middle frame to a greater extent to reduce a thickness of space under the screen, a thickness of the middle frame may be minimized.

Optionally, as shown in FIG. 7 and FIG. 8, a foam 240 is provided between an upper surface of the edge of the special-shaped support plate 210 and a lower surface of the display screen. Specifically, the foam may be provided on the upper surface of the inverted step structure 211 at the edge of the support plate 210, or may be provided on an upper surface of a region of a non-inverted step structure at the edge of the support plate 210.

Similarly, the technical solution related to the foam 240 may refer to the related description of the foam 240 in FIG. 5 above, and will not be repeated redundantly herein.

Optionally, in the embodiment of the present application, all regions of peripheral edges of the support plate 210 bend upward to form an inverted step structure 211, or partial regions of peripheral edges of the support plate 210 bend upward to form inverted step structures 211.

Figure 9A:
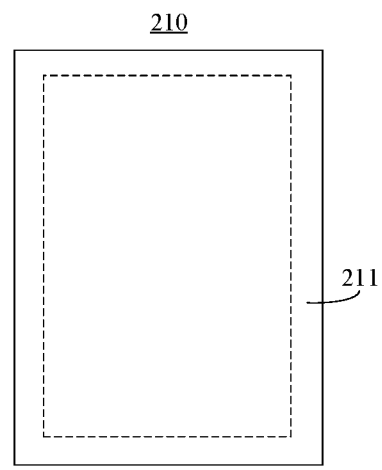
FIG. 9a to FIG. 9c are schematic top views of support plates according to embodiments of the present application.
Figure 9B:
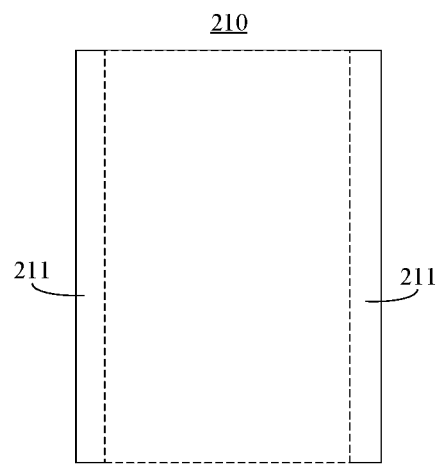
Figure 9C:
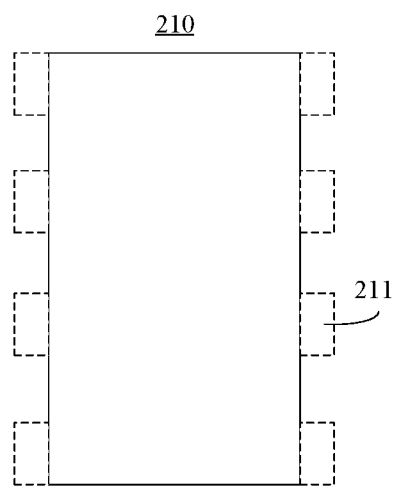

FIG. 9a to FIG. 9c show three schematic structural top views of a support plate 210. As shown in FIG. 9a, when the support plate 210 is a quadrilateral, edges of its four sides bend to form an inverted step structure 211. Optionally, in this case, a step structure 312 in a middle frame 300 may also be correspondingly formed at peripheral edges of a quadrilateral groove or a quadrilateral through hole.

As shown in FIG. 9b, edges on two opposite sides of the support plate 210 bend upward to form inverted step structures 211, while special-shaped processing is not performed on edges of the other two sides to ensure the edges of the other two sides of the support plate and a center of the support plate are located on the same level. Optionally, in this case, step structures 312 in a middle frame 300 may be formed at peripheral edges of a quadrilateral groove or a quadrilateral through hole, or may be formed at two sides of a quadrilateral groove or a quadrilateral through hole, corresponding to the support for the inverted step structures in the support plate.

As shown in FIG. 9c, partial regions of edges on two opposite sides of the support plate 210 bend upward to form a plurality of partial inverted step structures 211. Except the partial regions where the inverted step structures 211 are formed in the drawing, the other partial regions and a center of the support plate are located on the same level. Optionally, except that the inverted step structures are formed on the partial regions on two opposite sides of the support plate 210 shown in FIG. 9c, an inverted step structure may be formed on any partial region of peripheral regions of the support plate 210, which is not limited in the embodiment of the present application. Optionally, in this case, step structures 312 in a middle frame 300 may be formed at peripheral edges of a quadrilateral groove or a quadrilateral through hole, or may be correspondingly formed on partial regions of a quadrilateral groove or a quadrilateral through hole for supporting the inverted step structures in the support plate.

It should be understood that in addition to a quadrilateral structure, the support plate 210 may be a support plate in a circular shape or anther shape. Correspondingly, the shape of the groove or through hole in the middle frame may be similar to or the same as the shape of the support plate so that the groove or the through hole may accommodate the support plate.

Figure 10:
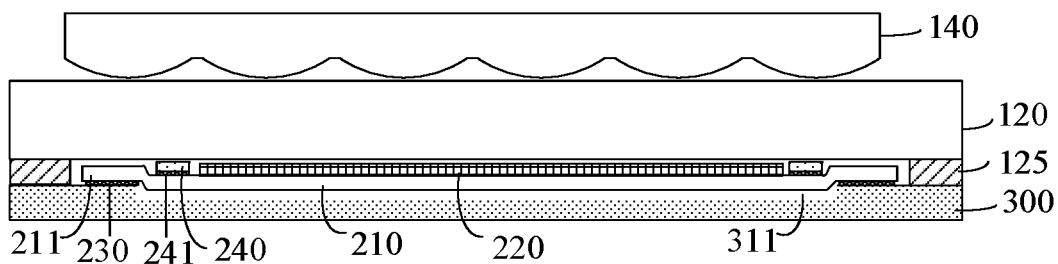
FIG. 10 is a schematic structural diagram of another fingerprint identification apparatus according to an embodiment of the present application.

FIG. 10 shows an installation structural diagram of another fingerprint identification apparatus 200 located under a display screen 120.

Optionally, in the embodiment of the present application, a support plate 210 is a special-shaped support plate, which may be similar to or the same as the special-shaped support plate in FIG. 7 or FIG. 8, and its edge bends upward to form an inverted step structure 211.

Specifically, in the embodiment of the present application, a middle frame 300 is provided with a groove 311, and the foregoing inverted step structure 211 overlaps peripheries of the groove 311. Optionally, as shown in FIG. 10, a lower surface of the foregoing inverted step structure 211 and upper surfaces of peripheral regions of the groove 311 may be bonded and fixed by an adhesive layer 230.

Specifically, in the embodiment of the present application, at least one fingerprint sensor chip 220 is also disposed in a central region of the support plate 210 instead of an edge region. In other words, the at least one fingerprint sensor chip 220 is not located on an upper surface of the inverted step structure 211 of the support plate 210.

Optionally, a lower surface of another region of the support plate 210 except the inverted step structure 211 may be attached to an upper surface of the groove 311 in the middle frame. Optionally, the lower surface of another region may also be bonded to the upper surface of the groove 311 in the middle frame by the adhesive layer 230.

Optionally, as shown in FIG. 10, there may be a certain air gap between the lower surface of another region of the support plate 210 except the inverted step structure 211 and the upper surface of the groove 311.

In the embodiment of the present application, by designing the support plate as a special-shaped structure, the inverted step structure at the edge of the support plate overlaps and is fixed to the middle frame, the central region of the support plate sinks with the groove or a through hole in the middle frame while the support plate is fixed to the middle frame, and the at least one fingerprint sensor chip is disposed on the central region. In other words, according to the solution of the embodiment of the present application, the fingerprint identification apparatus 200 is embedded in the middle frame to a greater extent with a thickness of the middle frame, which further saves a thickness of space under the screen.

Figure 11:
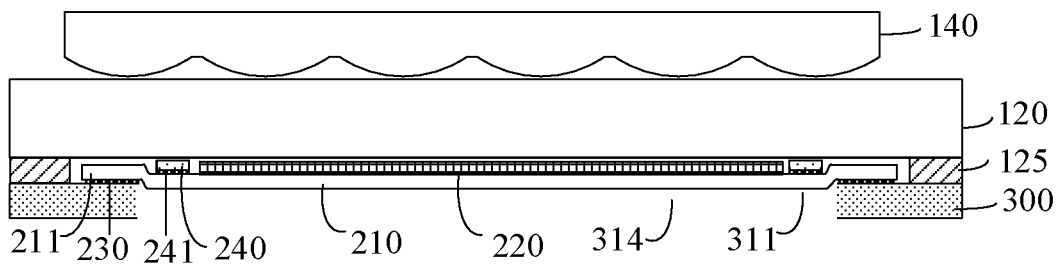
FIG. 11 is a schematic structural diagram of another fingerprint identification apparatus according to an embodiment of the present application.

Particularly, as shown in FIG. 11, when the middle frame 300 is not provided with the groove 311, but provided with a through hole 314, the inverted step structure 211 at the edge of the special-shaped support plate 210 may also overlap a region of an edge of the through hole 314, and the lower surface of the foregoing inverted step structure 211 and an upper surface of a step structure 312 are bonded and fixed by the adhesive layer 230.

In this case, while the fingerprint identification apparatus 200 is embedded in the middle frame to a greater extent to reduce a thickness of space under the screen, a thickness of the middle frame may be minimized.

Optionally, in the embodiment of the present application, the top view of the support plate 210 may be the same as that in any one of the cases in FIG. 9a to FIG. 9c, and all regions of peripheral edges of the support plate 210 bend upward to form the inverted step structure 211, or partial regions of peripheral edges of the support plate 210 bend upward to form inverted step structures 211.

Optionally, as shown in FIG. 10 and FIG. 11, a foam 240 is provided between an upper surface of the edge of the special-shaped support plate 210 and a lower surface of the display screen. Specifically, the foam may be provided on the upper surface of the inverted step structure 211 at the edge of the support plate 210, or may be provided on an upper surface of a region of a non-inverted step structure at the edge of the support plate 210.

Similarly, the technical solution related to the foam 240 may refer to the related description of the foam 240 in FIG. 5 above, and will not be repeated redundantly herein.

Optionally, the foregoing support plate 210 may be a stiffening steel sheet.

Optionally, in one possible embodiment, the support plate 210 may be a stiffening steel sheet in a flexible circuit board (Flexible Printed Circuit, FPC).

Figure 12:
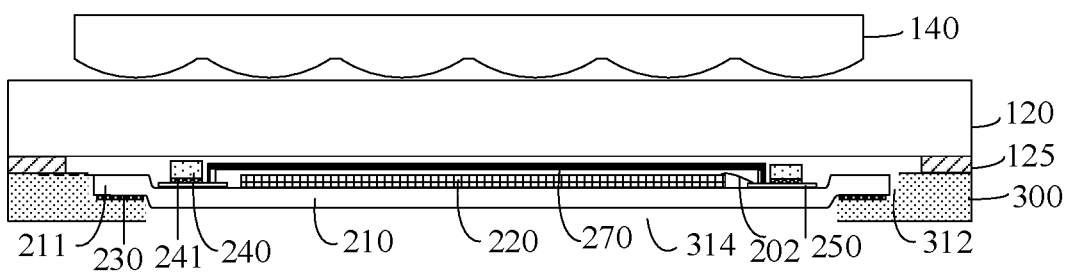
FIG. 12 is a schematic structural diagram of another fingerprint identification apparatus according to an embodiment of the present application.

FIG. 12 shows an installation structural diagram of another fingerprint identification apparatus 200 located under a display screen 120.

Optionally, as shown in FIG. 12, at least one fingerprint sensor chip 220 may be electrically connected to a flexible circuit board 250, and achieve electrical interconnection and signal transmission with other peripheral circuits or other elements of an electronic device through the flexible circuit board 250. For example, the at least one fingerprint sensor chip 220 may receive a control signal of a processing unit of the electronic device through the flexible circuit board 250, and may also output a fingerprint signal to the processing unit, a control unit or the like of the electronic device through the flexible circuit board 250.

Optionally, the foregoing flexible circuit board 250 may include a chip on film (chip on FPC, COF) layer and a plurality of electronic components. Optionally, the COF layer may be used as a carrier, and the electronic components s are directly encapsulated on the COF layer to form a chip encapsulation product. The COF layer may also be referred to as a COF flexible encapsulation substrate, the COF flexible encapsulation substrate refers to an encapsulated flexible substrate without a chip and components, which serves as an important component of a printed circuit board (PCB).

Optionally, the flexible circuit board 250 may be provided with an image processor. The image processor may be specifically a microprocessor (micro control unit, MCU) for receiving a fingerprint detecting signal (for example, a fingerprint image) transmitted from the at least one fingerprint sensor chip 220 through the flexible circuit board 250 and performing fingerprint identification based on the fingerprint detecting signal.

Optionally, the flexible circuit board 250 may be further provided with at least one capacitor for optimizing a fingerprint detecting signal captured by the at least one fingerprint sensor chip 220. For example, the at least one capacitor is configured to perform filtering processing on the fingerprint detecting signal captured by the at least one fingerprint sensor chip 220.

Optionally, the flexible circuit board 250 may be further provided with at least one storage unit for storing a fingerprint signal obtained after the processing by by the microprocessor. For example, the at least one storage unit is a flash memory (flash).

Figure 13:
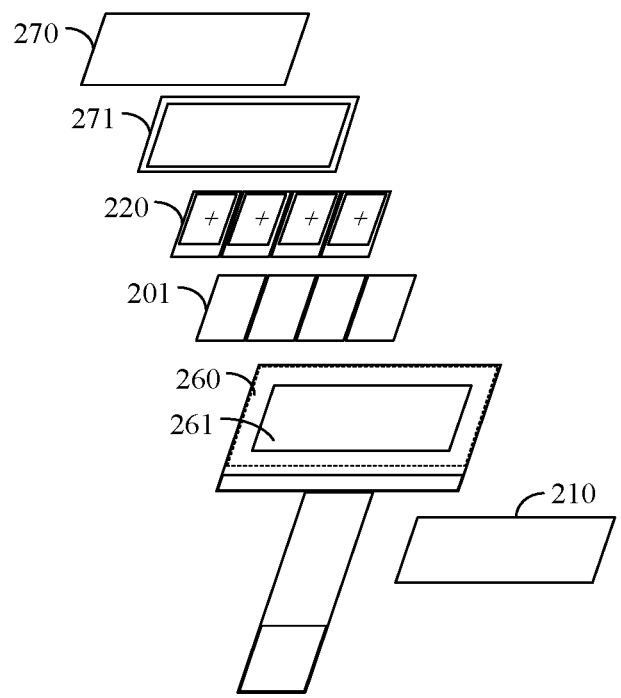
FIG. 13 is an explosion view of a single body of a fingerprint identification apparatus according to an embodiment of the present application.

FIG. 13 is an explosion view of a single body of a fingerprint identification apparatus 200 provided in an embodiment of the present application.

Optionally, as shown in FIG. 12 and FIG. 13, a flexible circuit board 250 may include a stiffening layer (stiffener) 210 (that is, an example of the foregoing support plate 210) and a circuit layer 260, the stiffening layer 210 is disposed under the circuit layer 260, the circuit layer 260 is provided with a window 261, at least one fingerprint sensor chip 220 is disposed in the window 261 and is connected to the stiffening layer 210 by an adhesive layer 201, and the at least one fingerprint sensor chip 220 is electrically connected to the circuit layer 260 through an electrical connection device 202.

Optionally, the stiffening layer 210 is a stiffening plate. It should be understood that a material of the stiffening plate may be a stainless steel, an aluminum foil, a glass fiber or another organic material, which is not limited in the embodiment of the present application. Preferably, the stiffening layer 210 is a metal stiffening steel sheet.

Optionally, the at least one fingerprint sensor chip 220 is bonded to the stiffening layer 210 by a die attach film (DAF) 201 to implement ultrathin connection between the at least one fingerprint sensor chip 220 and the stiffening layer 210.

Optionally, the electrical connection device 202 is any device that implements electrical connection, or may be a wire bonding (WB) device. For example, the electrical connection device 202 may be a bonding wire with a material of Au.

It should be understood that the foregoing electrical connection device may also be a micro metal connection post or other electrical connection manners such as a connector, as long as electrical connection between two electrical modules could be achieved, which is not limited in the embodiment of the present application.

Optionally, as shown in FIG. 12 and FIG. 13, the fingerprint identification apparatus 200 further includes: a filter 270, and the filter 270 is disposed between the at least one fingerprint sensor chip 220 and a display screen 120 for filtering out a light signal in a non-target wave band and transmitting a light signal in a target wave band.

Optionally, an area of the filter 270 is larger than an area of a fingerprint detecting region of the at least one fingerprint sensor chip 220.

Optionally, the filter 270 is located under the fingerprint detecting region, and an orthographic projection of the filter 270 on the display screen 120 covers the fingerprint detecting region.

Optionally, the filter 270 may include one or more optical filters; the one or more optical filters can be configured, for example, as bandpass filters to allow transmission of light emitted from an OLED display screen or transmission of light emitted by a light source assisted by fingerprint identification in an LCD display screen, while shielding other light components such as IR light in the sunlight.

In the embodiment of the present application, the filter 270 is used to reduce undesired ambient light in fingerprint sensing to improve optical sensing of received light by the at least one fingerprint sensor chip 220. The filter 270 may be specifically used to filter out light at a specific wavelength, such as near infrared light and partial of red light.

Optionally, reflectance of the filter 270 to light is less than 1%, thereby ensuring that the at least one fingerprint sensor chip 220 can receive sufficient light signals so as to improve a fingerprint identification effect.

Optionally, as shown in FIG. 12 and FIG. 13, the flexible circuit board 250 is further provided with an adhesive layer 271 for connecting the flexible circuit board 250 to the filter 270.

Optionally, as shown in FIG. 13, the adhesive layer 271 is in a hollow square shape or circular shape, and is disposed in a non-circuit region on the circuit layer 260.

Optionally, an adhesive width of the adhesive layer 271 is greater than 0.6 mm to ensure that the flexible circuit board 250 and the filter 270 are fixedly connected.

Optionally, an air gap between the filter 270 and the at least one fingerprint sensor chip 220 may not be filled with any auxiliary material, or may be filled with an adhesive material with a refractive index lower than a preset refractive index. For example, the preset refractive index includes, but is not limited to 1.3.

It should be noted that when the filter 270 is attached to an upper surface of the at least one fingerprint sensor chip 220 by filling of an optical adhesive, once a thickness of the adhesive covering the upper surface of the fingerprint sensor chip 220 is uneven, the Newton ring phenomenon may occur, thereby affecting the fingerprint identification effect. In the embodiment of the present application, there is an air layer or an adhesive with a low refractive index between the filter 270 and the at least one fingerprint sensor chip 220, which could avoid occurrence of the problem of the Newton ring to improve the fingerprint identification effect.

The foregoing filter 270 is disposed above the at least one fingerprint sensor chip 220 by the adhesive layer, and optionally, may further grows in the fingerprint sensor chip by a semiconductor process to form the filter layer 270 for passing a light signal in a target wave band and filtering out a light signal in a non-target wave band, and the filter layer 270 is integrated with the fingerprint sensor chip.

Optionally, the filter layer 270 grows on a surface of the sensor chip 220 and integrated in the sensor chip 220, and the filter layer 270 completely covers a light detection array 223 in the sensor chip 220.

Specifically, an evaporation process may be applied to perform plating on the light detection array 223 of the fingerprint sensor chip 220 to form the foregoing filter layer 270. For example, multiple layers of filter material films are prepared above the sensor chip 220 through methods such as atomic layer deposition, sputter plating, electron beam evaporation plating, ion beam plating.

Optionally, in the embodiment of the present application, the filter layer 270 includes multiple layers of oxide films, where the multiple layers of oxide films include a silicon oxide film and a titanium oxide film, and the silicon oxide film and the titanium oxide film alternately grow in sequence to form the filter layer 270; or the multiple layers of oxide films include a silicon oxide film and a niobium oxide film, and the silicon oxide film and the niobium oxide film alternately grow in sequence to form the filter layer 270.

Optionally, in the embodiment of the present application, a thickness of the filter layer 270 is between 1 μm and 10 μm.

Optionally, the filter layer 270 is configured to pass a light signal in a wave band range from 400 nm to 650 nm. In other words, the wavelength range of the foregoing target wave band includes a range from 400 nm to 650 nm.

It should be understood that the fingerprint identification apparatus 200 in FIG. 13 may be applicable to an installation manner of any one of the under-screen fingerprint identification apparatuses in FIG. 5 to FIG. 11, which is not limited in the embodiment of the present application.

Figure 14:
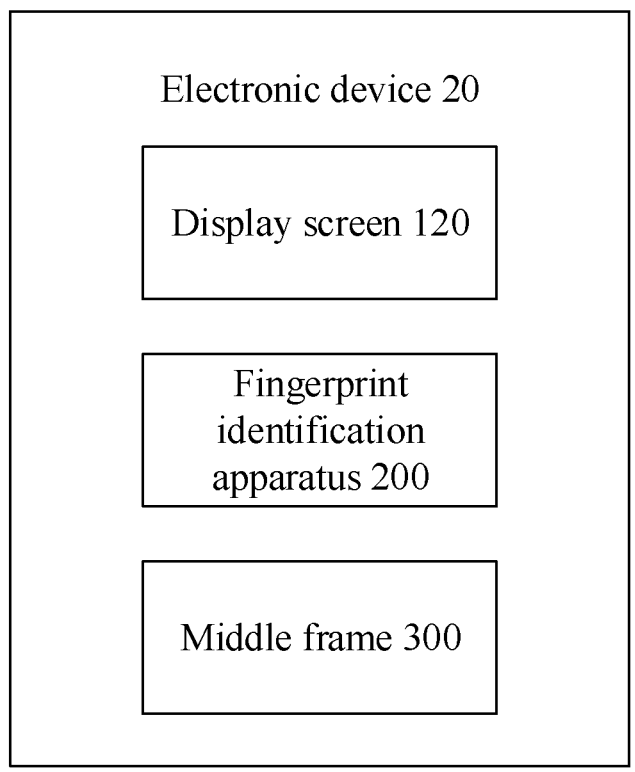
FIG. 14 is a schematic block diagram of an electronic device according to an embodiment of the present application.

As shown in FIG. 14, an embodiment of the present application further provides an electronic device 20, and the electronic device 20 may include the foregoing display screen 120, middle frame 300 and the fingerprint identification apparatus 200 according to the foregoing embodiments of the present application, where the fingerprint identification apparatus 200 is disposed under the display screen 120.

The electronic device may be any electronic device having a display screen. The display screen is an organic light-emitting diode screen, a liquid crystal display screen, or a flexible display screen.

Optionally, in one possible embodiment, an upper surface of the middle frame 300 extends downward and is provided with a groove, and the fingerprint identification apparatus is fixed in the groove.

Optionally, in another possible embodiment, an upper surface of the middle frame 300 extends downward and is provided with a groove or a through hole, a step structure is formed at an edge of the groove or an edge of the through hole, the fingerprint identification apparatus includes a support plate 210, and an edge of the support plate overlaps an upper surface of the step structure.

Optionally, in another possible embodiment, an upper surface of the middle frame 300 extends downward and is provided with a groove or a through hole, the fingerprint identification apparatus includes a support plate 210, and an edge of the support plate overlaps an edge of the groove or an edge of the through hole.

Optionally, the middle frame 300 is a structural member made of metal or plastic.

It should be understood that specific examples in embodiments of the present application are just for helping those skilled in the art better understand the embodiments of the present application, rather than for limiting the scope of the embodiments of the present application.

It should be understood that terms used in embodiments of the present application and the claims appended hereto are merely for the purpose of describing particular embodiments, and are not intended to limit the embodiments of the present application. For example, the use of a singular form of "a", "the above" and "said" in the embodiments of the present application and the claims appended hereto are also intended to include a plural form, unless otherwise clearly indicated herein by context.

Those of ordinary skill in the art may be aware that, units of the examples described in the embodiments disclosed in this paper may be implemented by electronic hardware, computer software, or a combination of the two. To clearly illustrate interchangeability between the hardware and the software, the foregoing illustration has generally described composition and steps of the examples according to functions. Whether these functions are performed by hardware or software depends on particular applications and designed constraint conditions of the technical solutions. Persons skilled in the art may use different methods to implement the described functions for each particular application, but it should not be considered that the implementation goes beyond the scope of the present application.

In the several embodiments provided in the present application, it should be understood that, the disclosed system and apparatus may be implemented in other manners. For example, the foregoing described apparatus embodiments are merely exemplary. For example, division of the units is merely logical function division and there may be other division manners in practical implementation. For example, multiple units or components may be combined or integrated into another system, or some features may be ignored or not executed. In addition, the displayed or discussed mutual coupling or direct coupling or communication connection may be indirect coupling or communication connection through some interfaces, apparatuses or units, and may also be electrical, mechanical, or connection in other forms.

The units described as separate components may or may not be physically separate, and components displayed as units may or may not be physical units, may be located in one position, or may be distributed on multiple network units. Part of or all of the units here may be selected according to a practical need to achieve the objectives of the solutions of the embodiments of the present application.

In addition, various functional units in the embodiments of the present application may be integrated into a processing unit, or each unit may exist alone physically, or two or more than two units may be integrated into one unit. The integrated unit may be implemented in a form of hardware, or may be implemented in a form of a software functional unit.

If the integrated unit is implemented in the form of the software functional unit and is sold or used as an independent product, it may be stored in a computer readable storage medium. Based on such understanding, the nature of the technical solutions of the present application, or the part contributing to the prior art, or all of or part of the technical solutions may be implemented in a form of software product. The computer software product is stored in a storage medium and includes several instructions for instructing a computer device (which may be a personal computer, a server, a network device, or the like) to execute all of or part of the steps of the method described in the embodiments of the present application. The storage medium includes: various media that may store program codes, such as a U-disk, a removable hard disk, a read-only memory (ROM), a random access memory (RAM), a magnetic disk, a compact disk, and so on.

The foregoing descriptions are merely specific implementations of the present application. The protection scope of the present application, however, is not limited thereto. Various equivalent modifications or replacements may be readily conceivable to any person skilled in the art within the technical scope disclosed in the present application, and such modifications or replacements shall fall within the protection scope of the present application. Therefore, the protection scope of the present application shall be subject to the protection scope of the claims. Therefore, the protection scope of the present application shall be subject to the protection scope of the claims.

What is claimed is:

1. A fingerprint identification apparatus, wherein the fingerprint identification apparatus is configured to be disposed under a display screen of an electronic device, and comprises:
    a support plate; and
    at least one fingerprint sensor chip, the at least one fingerprint sensor chip being disposed at an upper surface of the support plate;
    wherein an edge of the support plate bends upward to form an inverted step structure, an upper surface of a middle frame of the electronic device extends horizontally, downward and again horizontally to form a step structure and is provided with a groove wherein only a portion of the upper surface of the middle frame is proximate to entire lower surface of the support plate;
    the inverted step structure of the support plate is configured to be mounted to an edge of the groove, so that the at least one fingerprint sensor chip is located under the display screen of the electronic device; and
    the at least one fingerprint sensor chip is configured to receive a fingerprint detecting signal returned by reflection or scattering via a human finger on the display screen, wherein the fingerprint detecting signal is used to detect fingerprint information of the finger.

2. The fingerprint identification apparatus according to claim 1, wherein the inverted step structure is attached to the edge of the groove.

3. The fingerprint identification apparatus according to claim 2, wherein the step structure is formed at the edge of the groove, and the inverted step structure is attached to the step structure.

4. The fingerprint identification apparatus according to claim 1, wherein the inverted step structure is right-angled L-shaped or rounded-angled L-shaped, and a length of the inverted step structure is greater than 0.5 mm.

5. The fingerprint identification apparatus according to claim 1, wherein an upper surface of the inverted step structure and an upper surface of a peripheral region of the inverted step structure are located in a same plane.

6. The fingerprint identification apparatus according to claim 1, wherein a foam is provided between the inverted step structure and the at least one fingerprint sensor chip.

7. The fingerprint identification apparatus according to claim 1, wherein there is an air gap between a lower surface of a central region of the support plate and an upper surface of the groove.

8. The fingerprint identification apparatus according to claim 1, wherein a foam is provided between an upper surface of an edge of the support plate and a lower surface of the display screen.

9. The fingerprint identification apparatus according to claim 1, wherein the upper surface of the middle frame extends downward and is provided with a groove, and the support plate is fixed to an upper surface of the groove.

10. The fingerprint identification apparatus according to claim 1, wherein the support plate is fixed on the middle frame by glue, a solid adhesive or a foam, and the support plate is a stiffening steel sheet.

11. The fingerprint identification apparatus according to claim 1, wherein the fingerprint identification apparatus further comprises: a flexible circuit board, the flexible circuit board being electrically connected to the at least one fingerprint sensor chip by a gold wire, and the support plate is a stiffening steel sheet of the flexible circuit board.

12. The fingerprint identification apparatus according to claim 1, wherein the at least one fingerprint sensor chip comprises a plurality of optical fingerprint sensor chips, and the plurality of optical fingerprint sensor chips are arranged on the upper surface of the support plate side by side to be spliced into an optical fingerprint sensor chip component.

13. The fingerprint identification apparatus according to claim 1, wherein each of the at least one fingerprint sensor chip comprises: a micro lens array, at least one light resisting layer and a light detection array; and
    the at least one light resisting layer is disposed under the micro lens array, wherein the at least one light resisting layer is provided with a plurality of light passing holes, and the light detection array is disposed under the at least one light resisting layer;
    wherein the micro lens array is configured to converge the fingerprint detecting signal to the plurality of light passing holes of the at least one light resisting layer, and the fingerprint detecting signal is transmitted to the light detection array through the plurality of light passing holes.

14. The fingerprint identification apparatus according to claim 1, wherein the fingerprint identification apparatus further comprises:
a filter configured to filter out a light signal in a non-target wave band and transmit a light signal in a target wave band, and
the filter is fixed on the at least one fingerprint sensor chip by an adhesive layer, or is integrated in the at least one fingerprint sensor chip.

15. The fingerprint identification apparatus according to claim 1, wherein the support plate and/or the middle frame is a structural member made of a metal material or plastic, and the display screen is an organic light-emitting diode screen, a liquid crystal display screen, or a flexible display screen.

16. An electronic device, wherein the electronic device comprises: a display screen, a middle frame, and a fingerprint identification apparatus, wherein the fingerprint identification apparatus is disposed under the display screen, and is mounted to an upper surface of the middle frame; and the fingerprint identification apparatus comprises:
a support plate; and
at least one fingerprint sensor chip, the at least one fingerprint sensor chip being disposed at an upper surface of the support plate;
wherein an edge of the support plate bends upward to form an inverted step structure, the upper surface of the middle frame of the electronic device extends horizontally, downward and again horizontally to form a step structure and is provided with a groove wherein only a portion of the upper surface of the middle frame is proximate to entire lower surface of the support plate;
the inverted step structure of the support plate is configured to be mounted to an edge of the groove, so that the at least one fingerprint sensor chip is located under the display screen of the electronic device; and
the at least one fingerprint sensor chip is configured to receive a fingerprint detecting signal returned by reflection or scattering via a human finger on the display screen, wherein the fingerprint detecting signal is used to detect fingerprint information of the finger.

17. The electronic device according to claim 16, wherein the upper surface of the middle frame extends downward and is provided with the groove, and the fingerprint identification apparatus is fixed in the groove.

18. The electronic device according to claim 16, wherein the upper surface of the middle frame extends downward and is provided with the groove, the step structure is formed at an edge of the groove, the fingerprint identification apparatus comprises a support plate, and an edge of the support plate overlaps an upper surface of the step structure.

19. The electronic device according to claim 16, wherein the upper surface of the middle frame extends downward and is provided with the groove, the fingerprint identification apparatus comprises a support plate, and an edge of the support plate overlaps an edge of the groove.

20. The electronic device according to claim 16, wherein the display screen is an organic light-emitting diode, screen, a liquid crystal display screen, or a flexible display screen, and the middle frame is a structural member made of metal or plastic.

* * * * *